(12) United States Patent
Lo et al.

(10) Patent No.: US 9,995,770 B2
(45) Date of Patent: Jun. 12, 2018

(54) MULTIDIRECTIONAL SEMICONDUCTOR ARRANGEMENT TESTING

(71) Applicant: Taiwan Semiconductor Manufacturing Company Limited, Hsin-Chu (TW)

(72) Inventors: Tseng-Chin Lo, Hsinchu (TW); Huan Chi Tseng, Hsinchu (TW); Kuo-Chuan Chang, Longtan Township (TW); Yuan-Yao Chang, Fengshan (TW); Chien-Chang Lee, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 257 days.

(21) Appl. No.: 14/221,543

(22) Filed: Mar. 21, 2014

(65) Prior Publication Data

US 2015/0268271 A1 Sep. 24, 2015

(51) Int. Cl.
*G01R 1/04* (2006.01)
*G01R 31/26* (2014.01)
*G01R 1/073* (2006.01)

(52) U.S. Cl.
CPC ....... *G01R 1/0491* (2013.01); *G01R 1/07364* (2013.01); *G01R 31/2601* (2013.01)

(58) Field of Classification Search
CPC .. G01R 1/0491; G01R 31/26; G01R 31/2601; G01R 31/2603; G01R 1/07342; G01R 1/07307; G01R 1/07378; G01R 1/07392; G01R 31/2884; G01R 31/2886; G01R 31/2831; G01R 31/2889; G01R 31/318511; G01R 3/00; G11C 29/1201; G11C 29/48; G03F 9/7046; G03F 9/7084; H01L 2924/00; H01L 2924/0002; H01L 22/32; H01L 22/34; H01L 21/78; H01L 21/782; H01L 21/784; H01L 21/786;
(Continued)

(56) References Cited

U.S. PATENT DOCUMENTS 5,070,297 A * 12/1991 Kwon ............... G01R 31/31905
324/754.03
5,616,931 A * 4/1997 Nakamura .......... H01L 21/3043
257/48
(Continued)

*Primary Examiner* — Tung X Nguyen
*Assistant Examiner* — Lee Rodak
(74) *Attorney, Agent, or Firm* — Cooper Legal Group, LLC

(57) ABSTRACT

One or more probe cards, wafer testers, and techniques for testing a semiconductor arrangement are provided. Testline arrangements are formed within scribe lines of a semiconductor wafer, in multiple directions, such as an x-direction and a y-direction. A wafer tester is configured to concurrently test the semiconductor arrangement in multiple directions using a multidirectional probe arrangement of a probe card. In some embodiments, a first pin arrangement of the multidirectional probe arrangement is mated with a first testline arrangement in a first direction, and a second pin arrangement of the multidirectional probe arrangement is mated with a second testline arrangement in a second direction. The wafer tester concurrently tests the semiconductor arrangement in multiple directions, such as in the first direction and the second direction, through the pin arrangements mated with the testline arrangements.

20 Claims, 14 Drawing Sheets

(58) Field of Classification Search
CPC ... H01L 2223/5442; H01L 2223/54426; H01L 2223/54453; H01L 2223/5446; H01L 2224/02166; H01L 2224/05554; H01L 22/10; H01L 23/544
USPC ............... 324/754.01–754.2, 755.01–755.11, 324/756.01–756.07, 762.05, 762.06
See application file for complete search history.

(56) References Cited

U.S. PATENT DOCUMENTS

| | | | |
|---|---|---|---|
| 6,271,674 B1* | 8/2001 | Hasegawa | G01R 31/2886 324/756.03 |
| 6,333,635 B1* | 12/2001 | Lee | G01R 31/2886 324/754.07 |
| 2005/0024072 A1* | 2/2005 | Schaeffer | G01R 1/07342 324/756.03 |
| 2007/0252611 A1* | 11/2007 | Kerber | G01R 31/2884 324/750.3 |
| 2008/0073753 A1* | 3/2008 | Tsai | H01L 22/34 257/620 |
| 2011/0050267 A1* | 3/2011 | Pagani | G01R 1/07307 324/756.03 |
| 2014/0002122 A1* | 1/2014 | Dibattista | G01B 31/318511 324/750.24 |

* cited by examiner

MULTIDIRECTIONAL SEMICONDUCTOR ARRANGEMENT TESTING

BACKGROUND

A semiconductor arrangement comprises a plurality circuitry arrangements, such as a plurality integrated circuits formed on a wafer. Generally, the plurality of circuitry arrangements comprises multiple instances of a particular integrated circuit pattern or design where the instances are replicated or repeated across die of the wafer, such that a first die has a first instance of the integrated circuit, a second die has a second instance of the integrated circuit, etc. The integrated circuits, or rather the die upon which the integrated circuits are formed, are spaced apart by scribe lines on the wafer. A separation process, such as a die cut process or a wafer sawing process, is performed along the scribe lines to detach the integrated circuits from one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
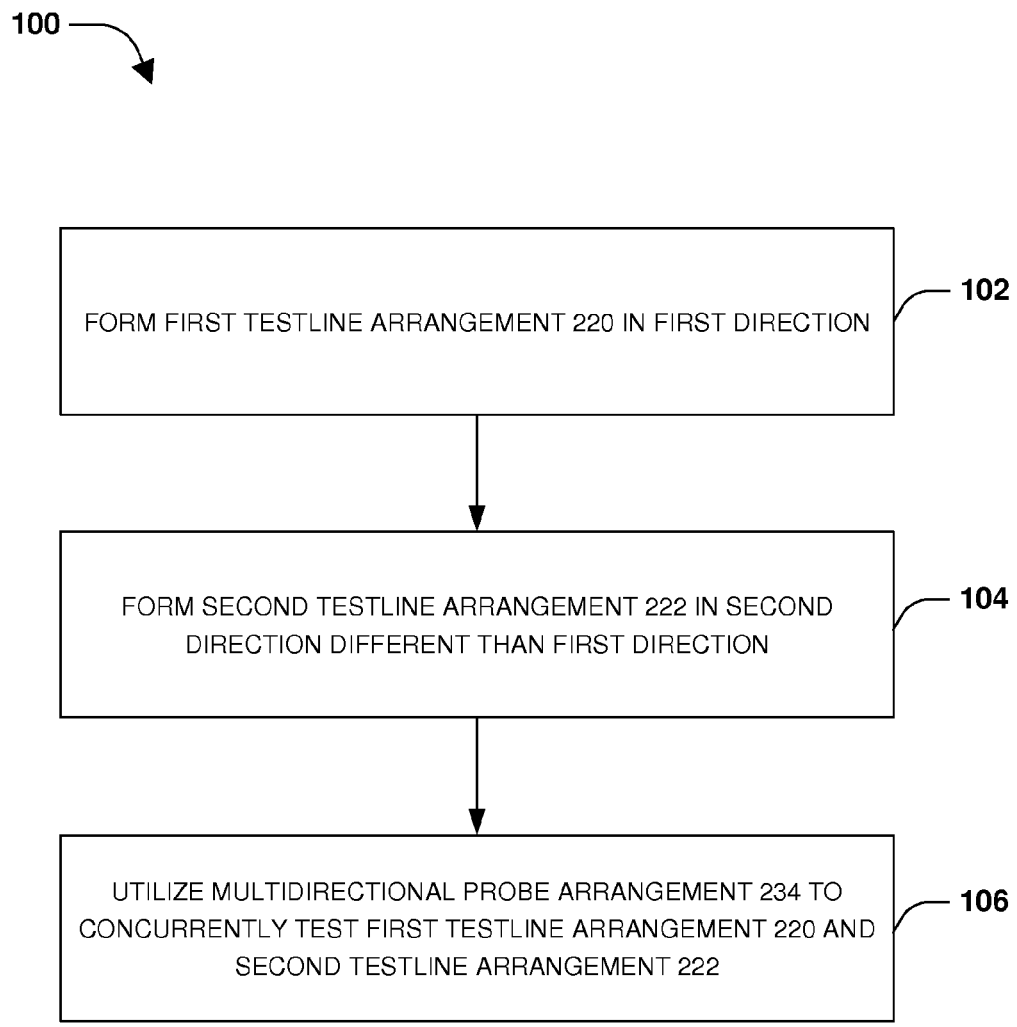
FIG. 1 is a flow diagram illustrating a method of testing a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly One or more probe cards, wafer testers, and techniques for testing a semiconductor arrangement are provide herein. In some embodiments, a probe card comprises a multidirectional probe arrangement. The multidirectional probe arrangement comprises a first pin arrangement aligned in a first direction, such as an x-direction. The multidirectional probe arrangement comprises a second pin arrangement aligned in a second direction different than the first direction, such as a y-direction. In some embodiments, a first testline arrangement is formed along a first scribe line of the semiconductor arrangement in the first direction, and a second testline arrangement is formed along a second scribe line of the semiconductor arrangement in the second direction. A wafer tester is configured to mate the first pin arrangement with the first testline arrangement and the second pin arrangement with the second testline arrangement. In this way, the wafer tester uses the multidirectional probe arrangement of the probe card to mate with testline arrangements, formed in multiple directions, for concurrent testing of the semiconductor arrangement in the multiple directions. Multidirectional testing increases throughput in semiconductor fabrication, such as an increase in wafers per hour (WPH), because merely a single multidirectional test is performed, as opposed to performing a first single directional test in the first direction with a single directional probe card and then modifying the orientation of the single directional probe card to perform a second single directional test in the second direction.

A method 100 of testing a semiconductor arrangement is illustrated in FIG. 1. In some embodiments, the semiconductor arrangement comprises circuitry arrangements, such as integrated circuits formed on die of a wafer, separated by one or more scribe lines. At 102, a first testline arrangement is formed along or within a first scribe line on the wafer. The first testline arrangement is formed in a first direction, such as an x-direction. In some embodiments, the first testline arrangement comprises one or more pads, such as aluminum pads, that are connected to at least one of one or more circuitry arrangements such as a first integrated circuit on a first die of the wafer or circuitry or devices similar to that comprised in one or more integrated circuits so as to give an indication of performance or behavior of circuitry or devices comprised in the one or more integrated circuits. According to some embodiments, testline arrangements are formed concurrently with formation of integrated circuits on the wafer during semiconductor fabrication, and thus components, devices, etc., such as transistors, within the testline arrangements have the same or similar characteristics as like components, devices, etc. within the integrated circuits, such as gate thickness, dopant implant depths, etc. Accordingly, testing the performance, behavior, etc. of one or more devices, components, etc. within a testline arrangement provides an indication of the performance, behavior, etc. of comparable devices, components, etc. of an integrated circuit. According to some embodiments, a testline arrangement is connected to at least some of an integrated circuit so as to provide a mechanism for testing at least some of the integrated circuit.

At 104, a second testline arrangement is formed along or within a second scribe line on the wafer. The second testline arrangement is formed in a second direction different than the first direction, such as a y-direction or a direction that is offline or perpendicular to the first testline arrangement. It is appreciated that the first direction and the second direction can be any directions that are different, and that testline arrangements can be any shape such as a linear shape, a circular shape, polygonal shape, etc. In some embodiments, the second testline arrangement comprises one or more pads, such as aluminum pads, that are connected to at least one of one or more circuitry arrangements such as a second integrated circuit on a second die of the wafer or circuitry or devices similar to that comprised in one or more integrated circuits so as to give an indication of performance or behavior of circuitry or devices comprised in the one or more integrated circuits.

At 106, a multidirectional probe arrangement is utilized to concurrently test the first testline arrangement and the second testline arrangement, such as for concurrently testing at least one of the first integrated circuit and the second integrated circuit or circuitry or devices similar to that comprised in one or more circuitry arrangements. In some embodiments, a first pin arrangement of the multidirectional probe arrangement is mated with the first testline arrangement, where the first pin arrangement and the first testline arrangement are aligned in the first direction. A second pin arrangement of the multidirectional probe arrangement is mated with the second testline arrangement, where the second pin arrangement and the second testline arrangement are aligned in the second direction. In some embodiments, a wafer tester concurrently tests circuitry arrangements in multiple directions by sending and receiving test signals through the first pin arrangement to the first testline in the first direction and through the second pin arrangement to the second testline line arrangement in the second direction. In this way, the semiconductor arrangement, or at least aspects thereof comprised in the first testline arrangement and the second testline arrangement, are concurrently tested in multiple directions, such as in a horizontal direction and a vertical direction, which mitigates overhead otherwise incurred by performing a first single directional test in the first direction using a single directional probe arrangement, reorienting the single directional probe arrangement from the first direction to the second direction, and then performing a second single directional test in the second direction using the reoriented single directional probe arrangement.

In some embodiments, a plurality of testline arrangements are formed along or within scribe lines of the semiconductor arrangement. In some embodiments, a third testline arrangement is formed along or within the first scribe line in the first direction. In some embodiments, the third testline arrangement comprises one or more pads, that are connected to at least one of one or more circuitry arrangements such as a third integrated circuit on a third die of the wafer or circuitry or devices similar to that comprised in one or more integrated circuits so as to give an indication of performance or behavior of circuitry or devices comprised in the one or more integrated circuits. A fourth testline arrangement is formed along or within the second scribe line in the second direction. In some embodiments, the fourth testline arrangement comprises one or more pads, such as aluminum pads, that are connected to at least one of one or more circuitry arrangements such as a fourth integrated circuit on a fourth die of the wafer or circuitry or devices similar to that comprised in one or more integrated circuits so as to give an indication of performance or behavior of circuitry or devices comprised in the one or more integrated circuits. The multidirectional probe arrangement is utilized to concurrently test the first testline arrangement, the second testline arrangement, the third testline arrangement, and the fourth testline arrangement. In some embodiments, a third pin arrangement of the multidirectional probe arrangement is mated with the third testline arrangement, where the third pin arrangement and the third testline arrangement are formed in the first direction. A fourth pin arrangement of the multidirectional probe arrangement is mated with the fourth testline arrangement, where the fourth pin arrangement and the fourth testline arrangement are formed in the second direction. In this way, concurrent multidirectional testing of semiconductor arrangements to promote testing efficiency and enhance throughput in semiconductor production.

Figure 2A:
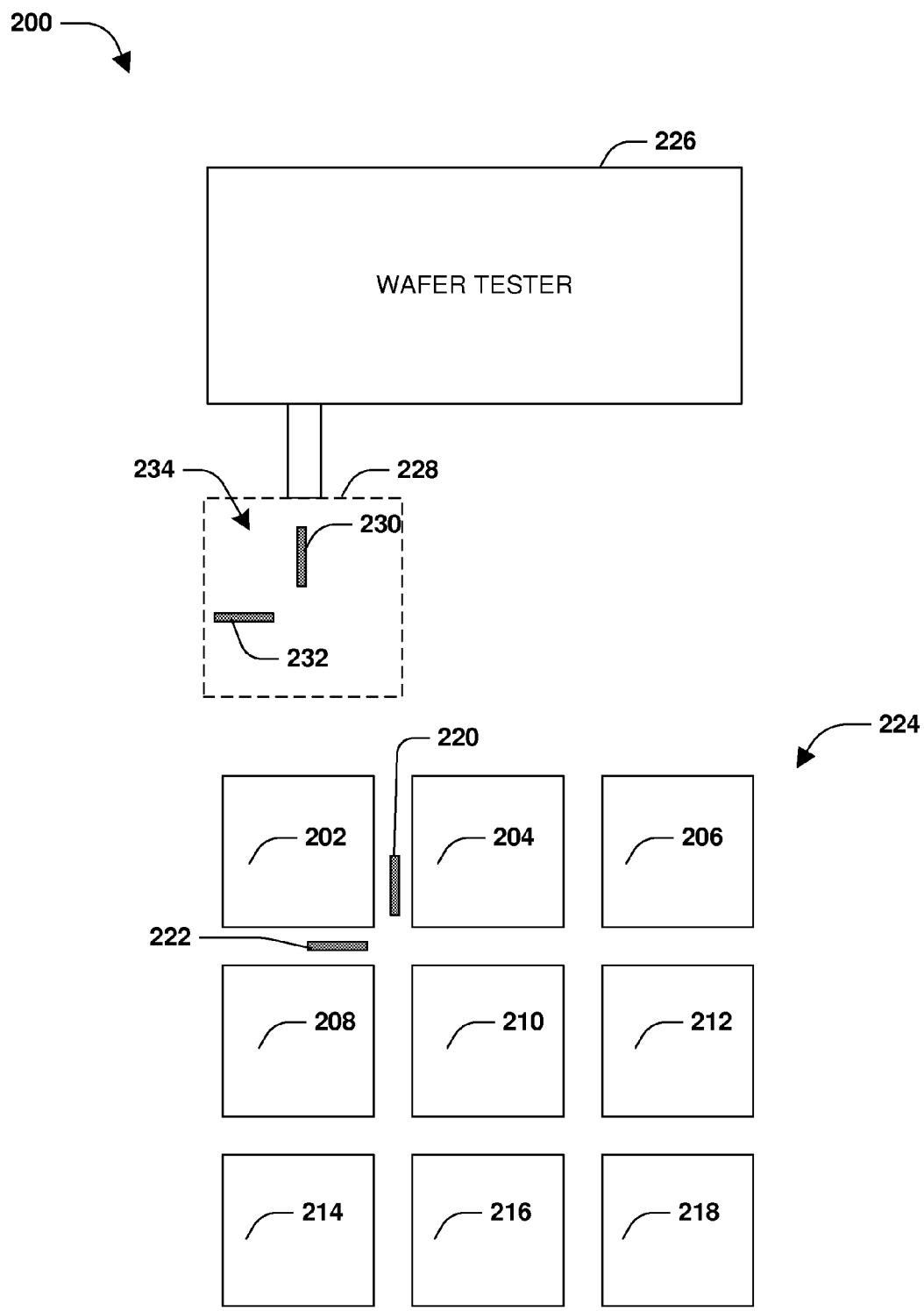
FIG. 2A is an illustration of a system for testing a semiconductor arrangement comprising a first testline arrangement in a first direction and a second testline arrangement in a second direction, in accordance with some embodiments.
Figure 2B:
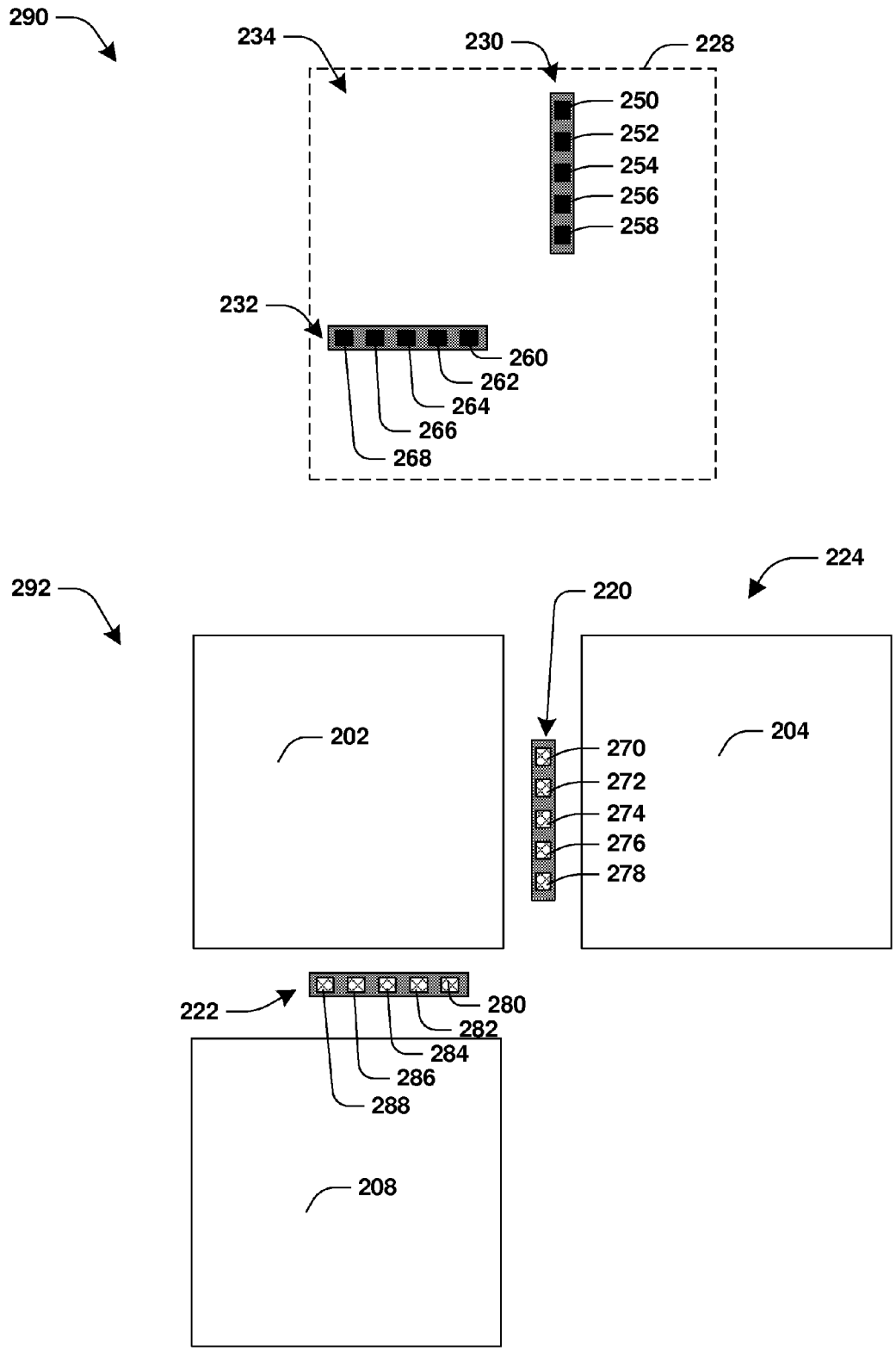
FIG. 2B is an illustration of a semiconductor arrangement comprising a first testline arrangement in a first direction and a second testline arrangement in a second direction, and a multidirectional probe arrangement comprising a first pin arrangement in the first direction and a second pin arrangement in the second direction, in accordance with some embodiments.

FIG. 2A illustrates a system 200 for testing a semiconductor arrangement 224. The semiconductor arrangement 224 comprises one or more integrated circuits such as a first circuitry arrangement 202, a second circuitry arrangement 204, a third circuitry arrangement 206, a fourth circuitry arrangement 208, a fifth circuitry arrangement 210, a sixth circuitry arrangement 212, a seventh circuitry arrangement 214, an eighth circuitry arrangement 216, a ninth circuitry arrangement 218, or other circuitry arrangements not illustrated. The semiconductor arrangement 224 comprises a first testline arrangement 220 formed along or within a first scribe line in a first direction, such as a y-direction. In some embodiments, the first testline arrangement 220 provides testing access to the first circuitry arrangement 202 and the second circuitry arrangement 204, such as through a first set of pads comprising a first pad 270, a second pad 272, a third pad 274, a fourth pad 276, and a fifth pad 278 illustrated in example 292 of FIG. 2B. In some embodiments, the first testline arrangement 220 comprises, devices, components, circuitry, transistors, resistories, or other devices under test (DUTs) akin to at least some of that comprised in an integrated circuit. The semiconductor arrangement 224 comprises a second testline arrangement 222 formed along or within a second scribe line in a second direction, such as an x-direction. In some embodiments, the second testline arrangement 222 provides testing access to the first circuitry 202 and the fourth circuitry 208, such as through a second set of pads comprising a sixth pad 280, a seventh pad 282, an eighth pad 284, a ninth pad 286, and a tenth pad 288 illustrated in example 292 of FIG. 2B. In some embodiments, the second testline arrangement 220 comprises, devices, components, circuitry, etc. akin to at least some of that comprised in an integrated circuit. It is to be appreciated that the instant application, including the scope of the appended claims, is not to be limited by the examples provided herein. In some embodiments, a testline arrangements has other than five pads. In some embodiments, a first number of pads of a first testline arrangement is different than a second number of pads of a second testline arrangement.

The system 200 comprises a wafer tester 226 and a probe card 228 comprising a multidirectional probe arrangement 234. The wafer tester 226 is configured to use the multidirectional probe arrangement 234 to concurrently test the semiconductor arrangement 224 in multiple directions. The multidirectional probe arrangement 234 comprises a first pin arrangement 230 aligned in the first direction, such as the y-direction. The first pin arrangement 230 comprises a first set of pins configured to mate with the first set of pads of the first testline arrangement 220, such as a first pin 250 configured to mate with the first pad 270, a second pin 252 configured to mate with the second pad 272, a third pin 254 configured to mate with the third pad 274, a fourth pin 256 configured to mate with the fourth pad 276, and a fifth pin 258 configured to mate with the fifth pad 278 as illustrated in example 290 of FIG. 2B. The multidirectional probe arrangement 234 comprises a second pin arrangement 232 aligned in the second direction, such as the x-direction. The second pin arrangement 232 comprises a second set of pins configured to mate with the second set of pads of the second testline arrangement 222, such as a sixth pin 260 configured to mate with the sixth pad 280, a seventh pin 262 configured to mate with the seventh pad 282, an eighth pin 264 configured to mate with the eighth pad 284, a ninth pin 266 configured to mate with the ninth pad 286, and a tenth pin 268 configured to mate with the tenth pad 288 as illustrated in example 290 of FIG. 2B.

Figure 2C:
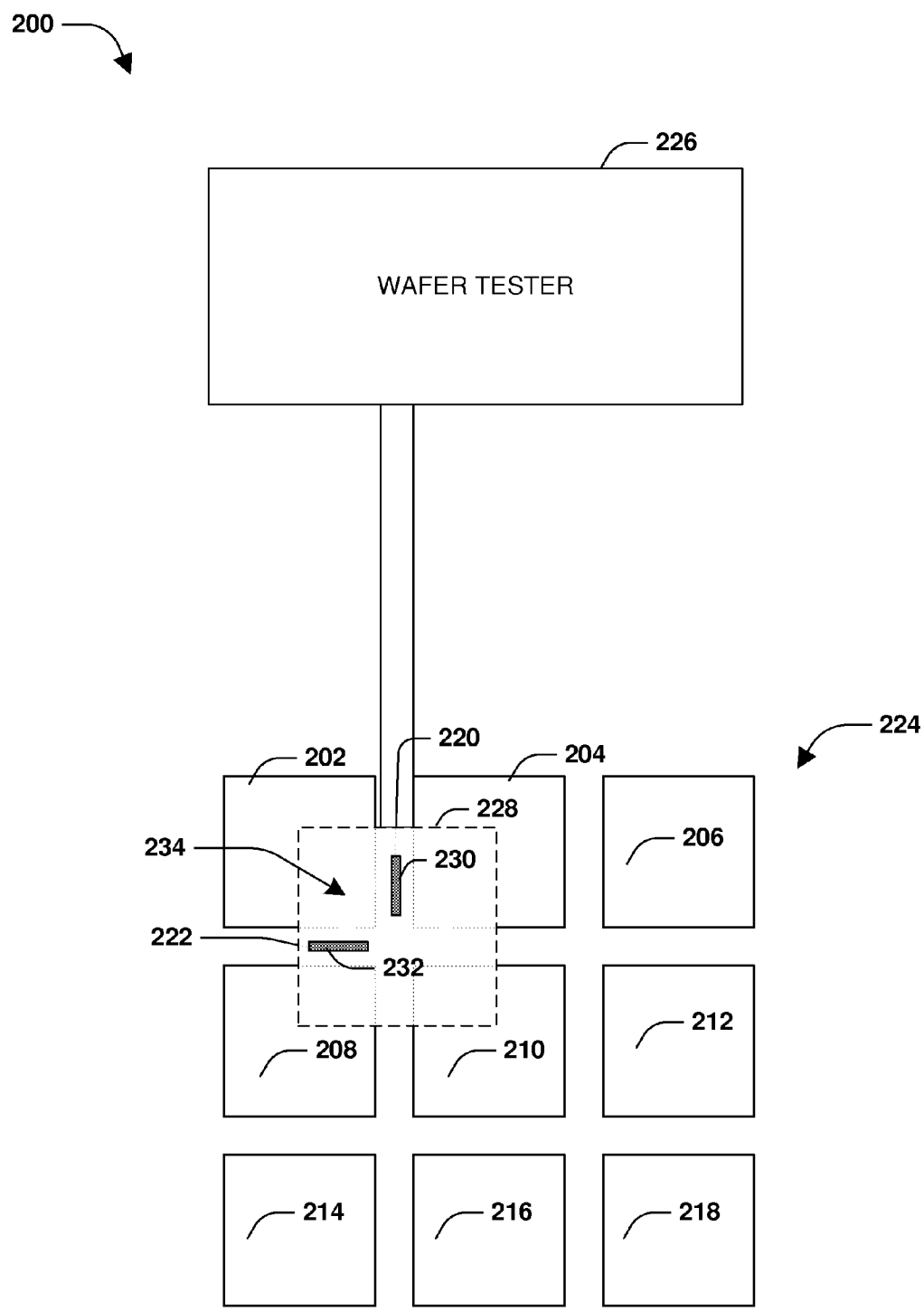
FIG. 2C is an illustration of a system for testing a semiconductor arrangement comprising a first testline arrangement in a first direction and a second testline arrangement in a second direction, in accordance with some embodiments.

As illustrated in FIG. 2C, the wafer tester 226 concurrently mates the first pin arrangement 230 with the first testline arrangement 220 and the second pin arrangement 232 with the second testline arrangement 222. According to some embodiments, the wafer tester 226 is configured to perform a first test of the first testline arrangement 220, such as a test of the first circuitry arrangement 202 and the second circuitry arrangement 204, using the first pin arrangement 230 mated with the first testline arrangement 220. According to some embodiments, the wafer tester 226 is configured to perform a second test, concurrent with the first test, of the second testline arrangement 232, such as a test of the first circuitry arrangement 202 and the fourth circuitry arrangement 208, using the second pin arrangement 232 mated with the second testline arrangement 222.

Figure 3A:
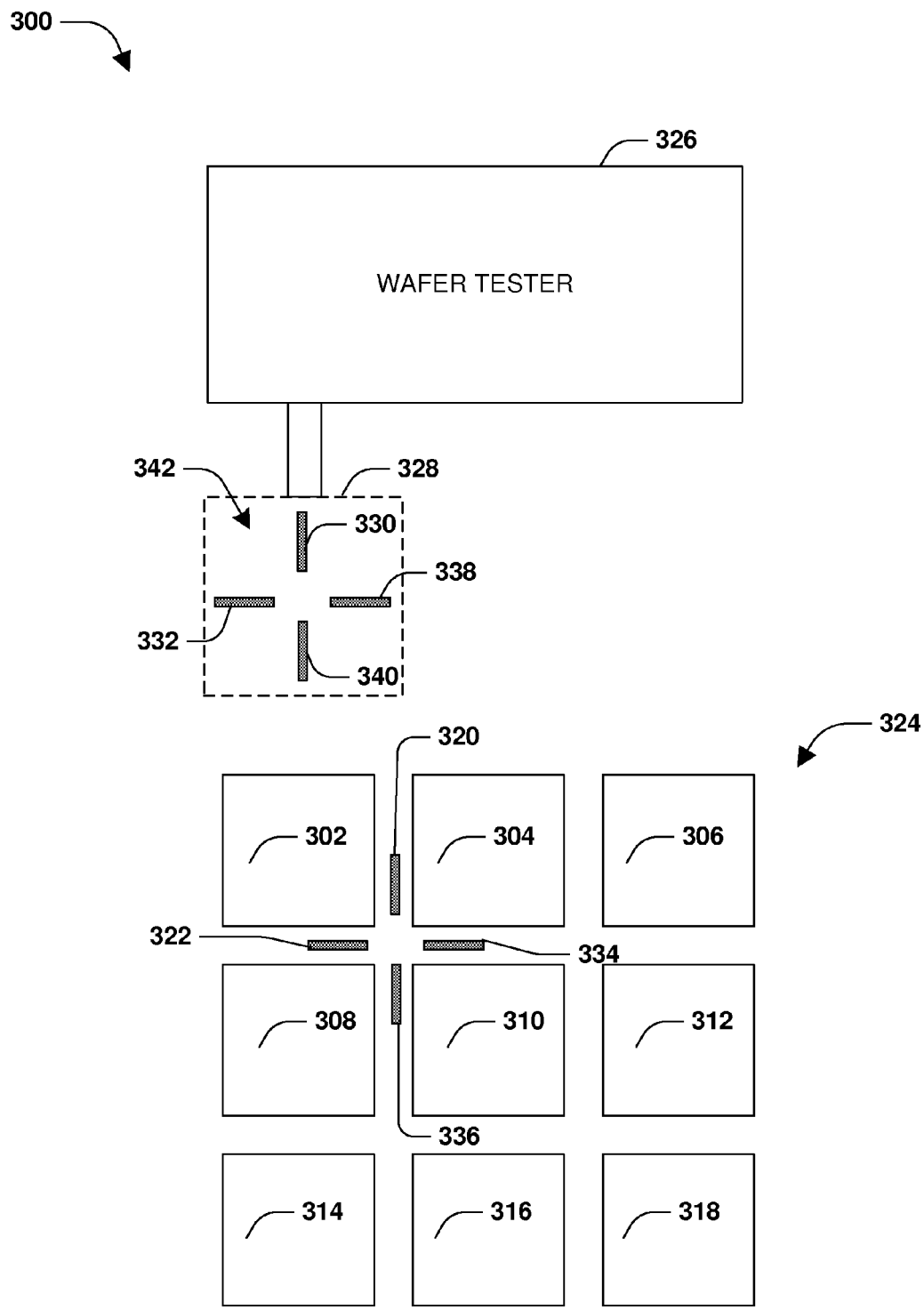
FIG. 3A is an illustration of a system for concurrently testing a semiconductor arrangement in multiple directions, in accordance with some embodiments.

FIG. 3A illustrates a system 300 for testing a semiconductor arrangement 324. The semiconductor arrangement 324 comprises one or more integrated circuits such as a first circuitry arrangement 302, a second circuitry arrangement 304, a third circuitry arrangement 306, a fourth circuitry arrangement 308, a fifth circuitry arrangement 310, a sixth circuitry arrangement 312, a seventh circuitry arrangement 314, an eighth circuitry arrangement 316, a ninth circuitry arrangement 318, or other circuitry arrangements not illustrated. The semiconductor arrangement 324 comprises a first testline arrangement 320 and a third testline arrangement 336 formed along or within a first scribe line in a first direction, such as a y-direction. In some embodiments, the first testline arrangement 320 provides testing access to the first circuitry arrangement 302 and the second circuitry arrangement 304, and the third testline arrangement 336 provides testing access to the fourth circuitry arrangement 308 and the fifth circuitry arrangement 310. In some embodiments, at least one of the first testline arrangement 320 or the third testline arrangement 336 comprises, devices, components, circuitry, etc. akin to at least some of that comprised in an integrated circuit. The semiconductor arrangement 324 comprises a second testline arrangement 322 and a fourth testline arrangement 334 formed along or within a second scribe line in a second direction, such as an x-direction. In some embodiments, the second testline arrangement 322 provides testing access to the first circuitry arrangement 302 and the fourth circuitry arrangement 308, and the fourth testline arrangement 334 provides testing access to the second circuitry arrangement 304 and the fifth circuitry arrangement 310. In some embodiments, at least one of the second testline arrangement 322 or the fourth testline arrangement 334 comprises, devices, components, circuitry, etc. akin to at least some of that comprised in an integrated circuit.

The system 300 comprises a wafer tester 326 and a probe card 328 comprising a multidirectional probe arrangement 342. The wafer tester 326 is configured to use the multidirectional probe arrangement 342 to concurrently test the semiconductor arrangement 324 in multiple directions. The multidirectional probe arrangement 334 comprises a first pin arrangement 330 and a third pin arrangement 340 aligned in the first direction, such as the y-direction. The first pin arrangement 330 comprises a first set of pins configured to mate with the first testline arrangement 320. The third pin arrangement 340 comprises a third set of pins configured to mate with the third testline arrangement 336. The multidirectional probe arrangement 342 comprises a second pin arrangement 332 and a fourth pin arrangement 338 aligned in the second direction, such as the x-direction. The second pin arrangement 332 comprises a second set of pins configured to mate with the second testline arrangement 322. The fourth pin arrangement 338 comprises a fourth set of pins configured to mate with the fourth testline arrangement 334.

Figure 3B:
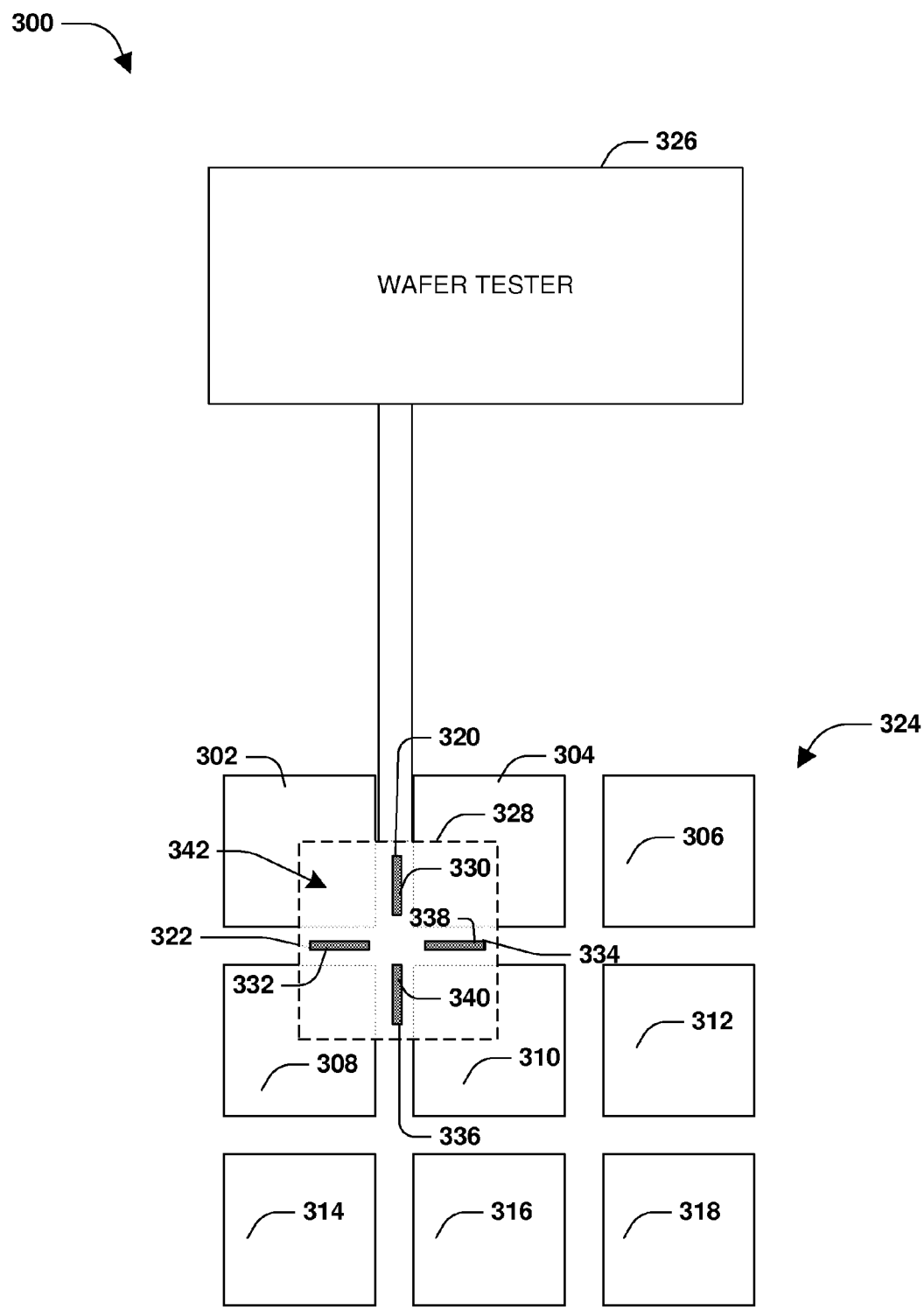
FIG. 3B is an illustration of a system for concurrently testing a semiconductor arrangement in multiple directions, in accordance with some embodiments.

As illustrated in FIG. 3B, the wafer tester 326 concurrently mates the first pin arrangement 330 with the first testline arrangement 320, the second pin arrangement 332 with the second testline arrangement 322, the third pin arrangement 340 with the third testline arrangement 336, and the fourth pin arrangement 338 with the fourth testline arrangement 334. According to some embodiments, the wafer tester 326 is configured to concurrently use the first testline arrangement 330, the second testline arrangement 322, the third testline arrangement 340, and the fourth testline arrangement 338 to concurrently test the first circuitry arrangement 302, the second circuitry arrangement 304, the fourth circuitry arrangement 308, the fifth circuitry arrangement 310, or other circuitry arrangements.

Figure 4A:
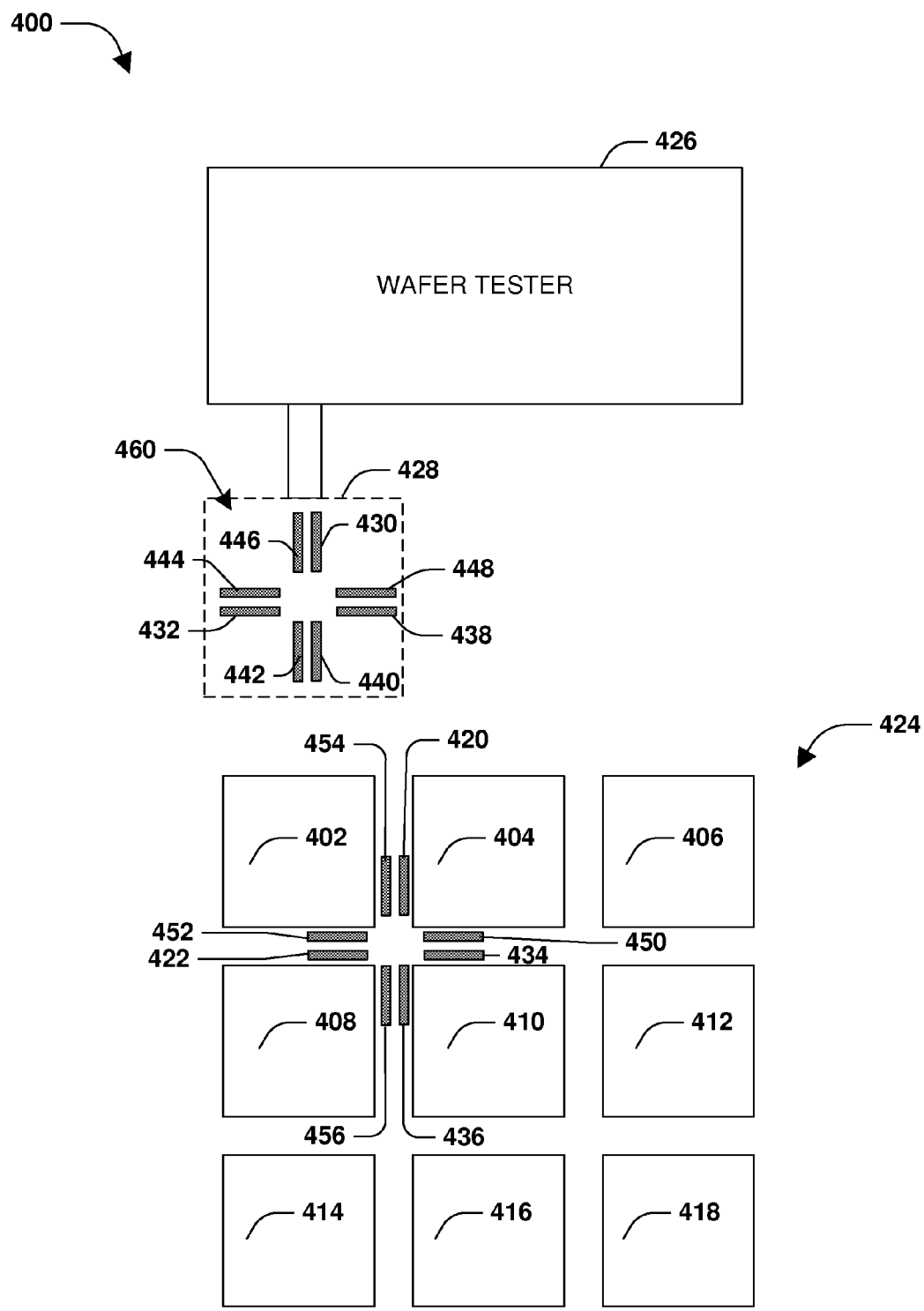
FIG. 4A is an illustration of a system for concurrently testing a semiconductor arrangement in multiple directions, in accordance with some embodiments.

FIG. 4A illustrates a system 400 for testing a semiconductor arrangement 424. The semiconductor arrangement 424 comprises one or more integrated circuits such as a first circuitry arrangement 402, a second circuitry arrangement 404, a third circuitry arrangement 406, a fourth circuitry arrangement 408, a fifth circuitry arrangement 410, a sixth circuitry arrangement 412, a seventh circuitry arrangement 414, an eighth circuitry arrangement 416, a ninth circuitry arrangement 418, or other circuitry arrangements not illustrated. The semiconductor arrangement 424 comprises a first testline arrangement 420, a third testline arrangement 436, a fifth testline arrangement 454, and a sixth testline arrangement 456 formed along or within a first scribe line in a first direction, such as a y-direction. In some embodiments, at least a portion of the first testline arrangement 420 is formed adjacent to at least a portion of the fifth testline arrangement 454. In some embodiments, at least a portion of the third testline arrangement 436 is formed adjacent to at least a portion of the sixth testline arrangement 456. In some embodiments, the first testline arrangement 420 provides testing access to the second circuitry arrangement 404, the third testline arrangement 436 provides testing access to the fifth circuitry arrangement 410, the fifth testline arrangement 454 provides testing access to the first circuitry arrangement 402, and the sixth testline arrangement 456 provides testing access to the fourth circuitry arrangement 408. In some embodiments, at least one of the testline arrangements comprises, devices, components, circuitry, etc. akin to at least some of that comprised in an integrated circuit.

The semiconductor arrangement 424 comprises a second testline arrangement 422, a fourth testline arrangement 434, a seventh testline arrangement 452, and an eighth testline arrangement 450 formed along or within a second scribe line in a second direction, such as an x-direction. In some embodiments, at least a portion of the second testline arrangement 422 is formed adjacent to at least a portion of the seventh testline arrangement 452. In some embodiments, at least a portion of the fourth testline arrangement 434 is formed adjacent to at least a portion of the eighth testline arrangement 450. In some embodiments, the second testline arrangement 422 provides testing access to the fourth circuitry arrangement 408, the fourth testline arrangement 434 provides testing access to the fifth circuitry arrangement 410, the seventh testline arrangement 452 provides testing access to the first circuitry arrangement 402, and the eighth testline arrangement 450 provides testing access to the second circuitry arrangement 404. In some embodiments, at least one of the testline arrangements comprises, devices, components, circuitry, etc. akin to at least some of that comprised in an integrated circuit.

The system 400 comprises a wafer tester 426 and a probe card 428 comprising a multidirectional probe arrangement 460. The wafer tester 426 is configured to use the multidirectional probe arrangement 460 to concurrently test the semiconductor arrangement 424 in multiple directions. The multidirectional probe arrangement 460 comprises a first pin arrangement 430, a third pin arrangement 440, a fifth pin arrangement 446, and a sixth pin arrangement 442 aligned in the first direction, such as the y-direction. The first pin arrangement 430 comprises a first set of pins configured to mate with the first testline arrangement 420. The third pin arrangement 440 comprises a third set of pins configured to mate with the third testline arrangement 436. The fifth pin arrangement 446 comprises a fifth set of pins configured to mate with the fifth testline arrangement 454. The sixth pin arrangement 442 comprises a sixth set of pins configured to mate with the sixth testline arrangement 456.

The multidirectional probe arrangement 460 comprises a second pin arrangement 432, a fourth pin arrangement 438, a seventh pin arrangement 444, and an eighth pin arrangement 448 aligned in the second direction, such as the x-direction. The second pin arrangement 432 comprises a second set of pins configured to mate with the second testline arrangement 422. The fourth pin arrangement 438 comprises a fourth set of pins configured to mate with the fourth testline arrangement 434. The seventh pin arrangement 444 comprises a seventh set of pins configured to mate with the seventh testline arrangement 452. The eighth pin arrangement 448 comprises an eighth set of pins configured to mate with the eighth testline arrangement 450.

Figure 4B:
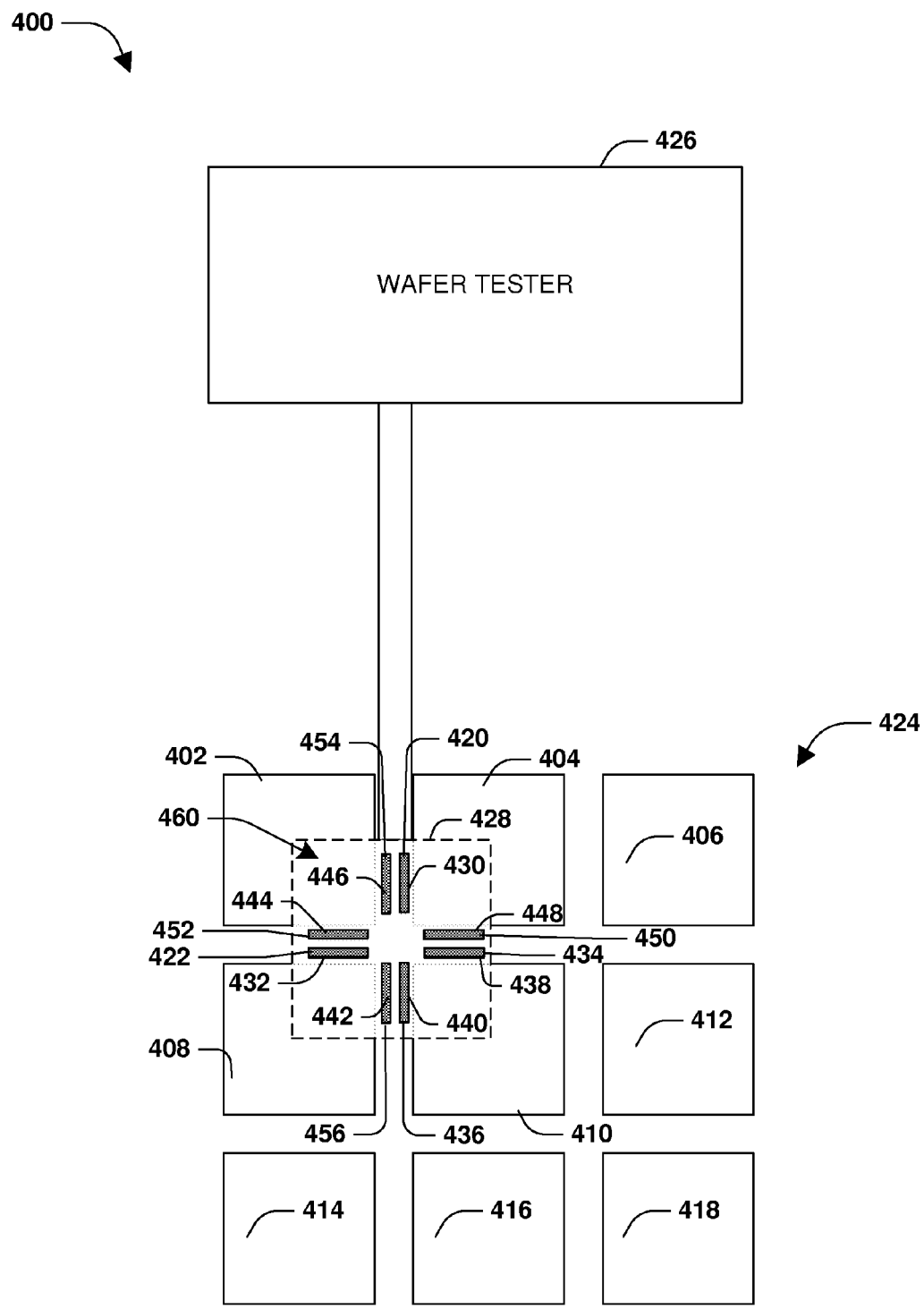
FIG. 4B is an illustration of a system for concurrently testing a semiconductor arrangement in multiple directions, in accordance with some embodiments.

As illustrated in FIG. 4B, the wafer tester 426 concurrently mates the first pin arrangement 423 with the first testline arrangement 420, the second pin arrangement 432 with the second testline arrangement 422, the third pin arrangement 440 with the third testline arrangement 436, and the fourth pin arrangement 438 with the fourth testline arrangement 434, the fifth pin arrangement 446 with the fifth testline arrangement 454, the sixth pin arrangement 442 with the sixth testline arrangement 456, the seventh pin arrangement 444 with the seventh testline arrangement 452, and the eighth pin arrangement 448 with the eighth testline arrangement 450. According to some embodiments, the wafer tester 426 is configured to concurrently use the first testline arrangement 420, the second testline arrangement 422, the third testline arrangement 436, and the fourth testline arrangement 434, the fifth testline arrangement 454, the sixth testline arrangement 456, the seventh testline arrangement 452, and the eighth testline arrangement 450 to concurrently test the first circuitry arrangement 402, the second circuitry arrangement 404, the fourth circuitry arrangement 408, the fifth circuitry arrangement 410, or other circuitry arrangements.

Figure 5A:
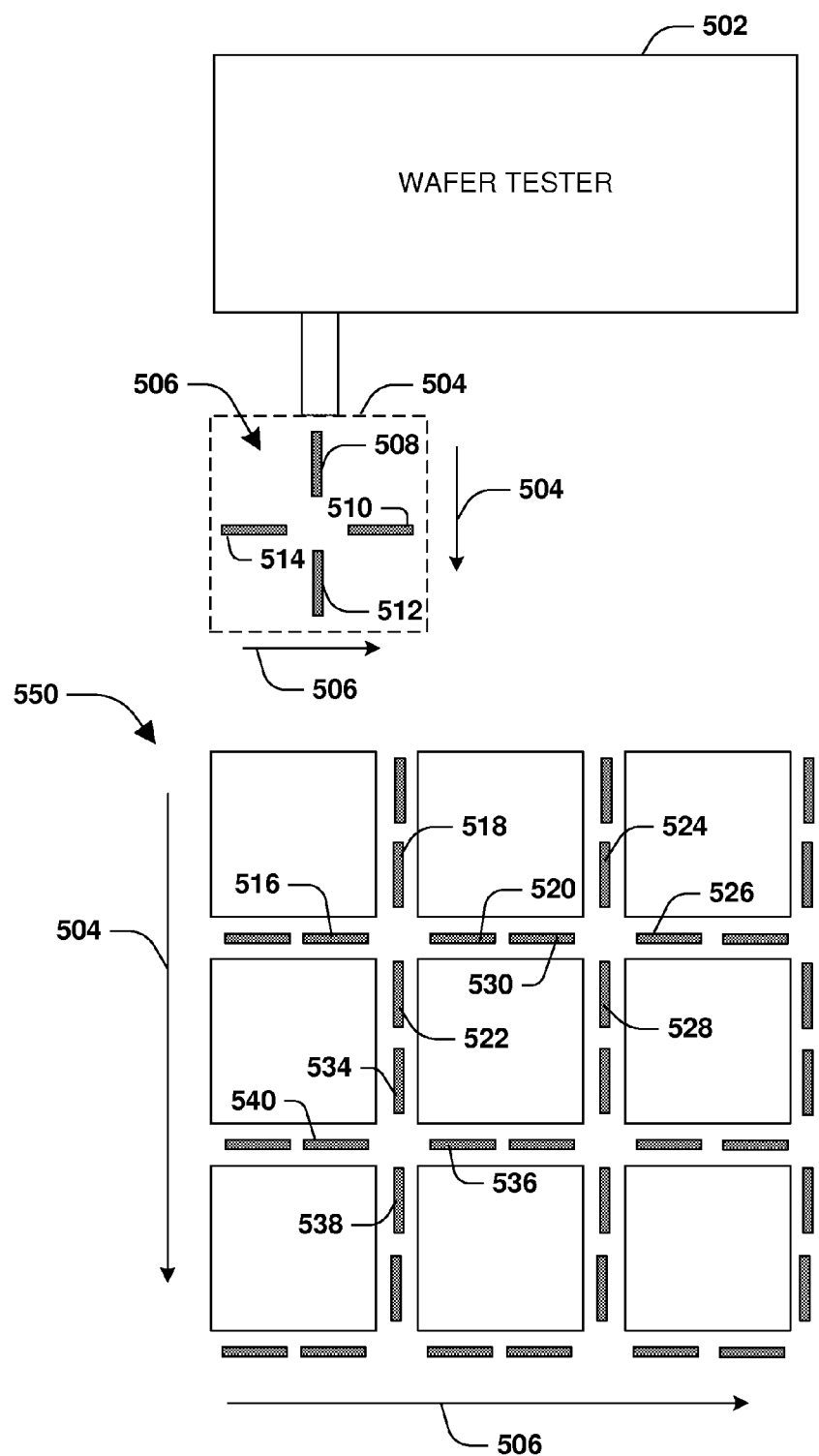
FIG. 5A is an illustration of a system for testing a semiconductor arrangement, in accordance with some embodiments.

In some embodiments, a probe card is configured to test a variety of testline arrangements formed on semiconductor arrangements, as illustrated in FIGS. 5A-7. As illustrated in FIG. 5A, a wafer tester 502 is configured to use a probe card 504 comprising a multiple probe arrangement 506 comprising a first pin arrangement 508 and a second pin arrangement 512 aligned in a first direction 504 and a third pin arrangement 510 and a fourth pin arrangement 514 aligned in a second direction 506. The wafer tester 502 is configured to test a semiconductor arrangement 550 by sequentially mating the multiple probe arrangement 506 with testline arrangements aligned in the first direction 504 and the second direction 506, as illustrated in FIGS. 5B-5D.

Figure 5B:
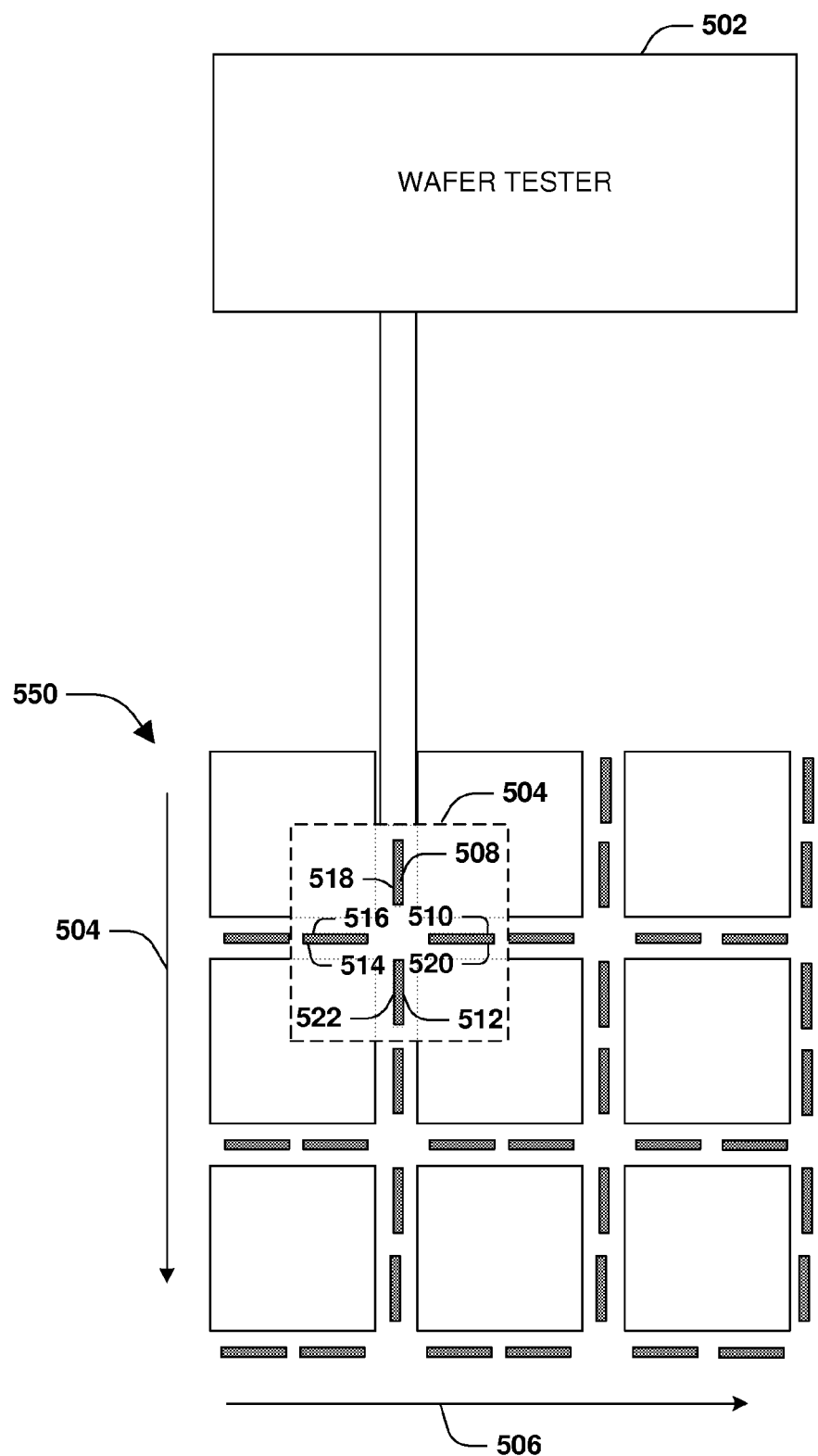
FIG. 5B is an illustration of testing a semiconductor arrangement, in accordance with some embodiments.

As illustrated in FIG. 5B, the wafer tester 502 performs a first test of the semiconductor arrangement 550. The wafer tester 502 mates the probe card 504 with a first set of testline arrangements comprising a first testline arrangement 518, a second testline arrangement 522, a third testline arrangement 520, and a fourth testline arrangement 516. In this way, the wafer tester 502 tests the first testline arrangement 518 using the first pin arrangement 508, the second testline arrangement 522 using the second pin arrangement 512, the third testline arrangement 520 using the third pin arrangement 510, and the fourth testline arrangement 516 using the fourth pin arrangement 514.

Figure 5C:
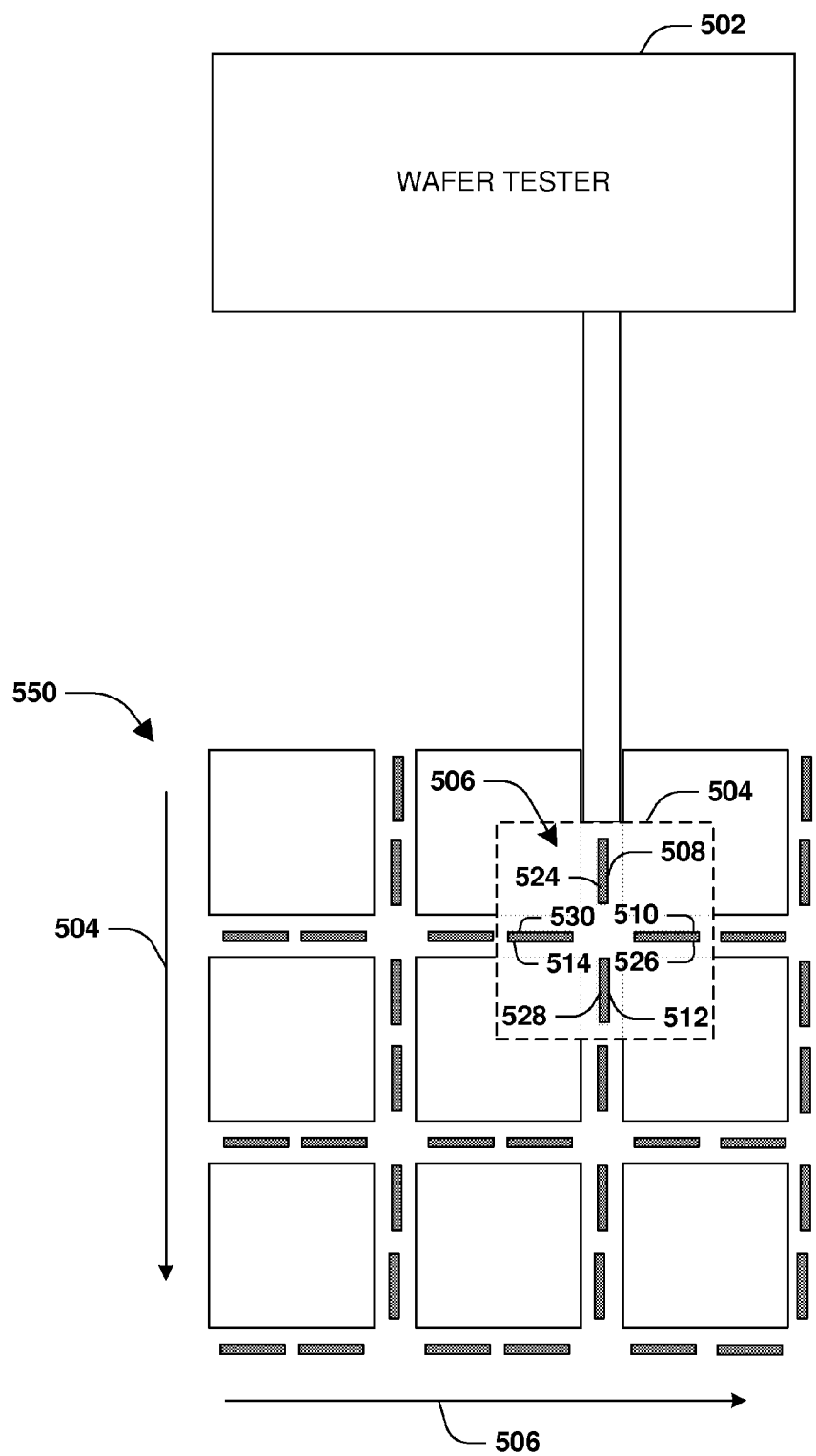
FIG. 5C is an illustration of sequentially testing a semiconductor arrangement along an x-axis, in accordance with some embodiments.

As illustrated in FIG. 5C, the wafer tester 502 performs a second test of the semiconductor arrangement 550, such as a sequential test in the second direction 506 such as a long an x-axis. The wafer tester 502 mates the probe card 504 with a second set of testline arrangements comprising a fifth testline arrangement 524, a sixth test line arrangement 528, a seventh testline arrangement 526, and an eighth testline arrangement 530. In this way, the wafer tester 502 tests the fifth testline arrangement 524 using the first pin arrangement 508, the sixth testline arrangement 528 using the second pin arrangement 512, the seventh testline arrangement 526 using the third pin arrangement 510, and the eighth testline arrangement 530 using the fourth pin arrangement 514. The wafer tester 502 may sequentially test other sets of testline arrangements along the x-axis.

Figure 5D:
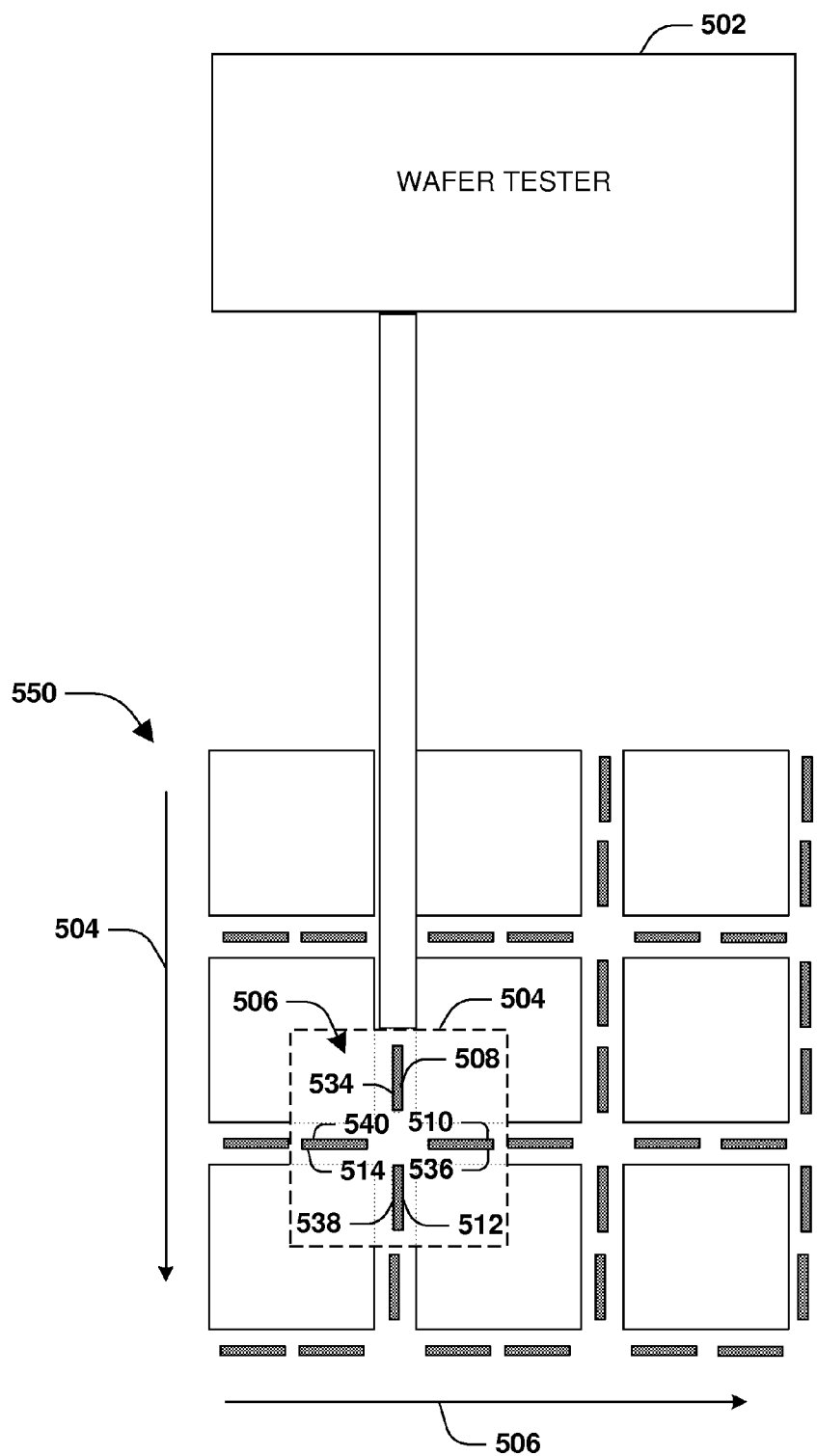
FIG. 5D is an illustration of sequentially testing a semiconductor arrangement along a y-axis, in accordance with some embodiments.

As illustrated in FIG. 5D, the wafer tester 502 performs a third test of the semiconductor arrangement 550, such as a sequential test in the first direction 504 such as along a y-axis. The wafer tester 502 mates the probe card 504 with a third set of testline arrangements comprising a ninth testline arrangement 534, a tenth testline arrangement 538, an eleventh testline arrangement 536, and a twelfth testline arrangement 540. In this way, the wafer tester 502 tests the ninth testline arrangement 534 using the first pin arrangement 508, the tenth testline arrangement 538 using the second pin arrangement 512, the eleventh testline arrangement 536 using the third pin arrangement 510, and the twelfth testline arrangement 540 using the fourth pin arrangement 514. The wafer tester 502 may sequentially test other sets of testline arrangements along the y-axis.

Figure 6:
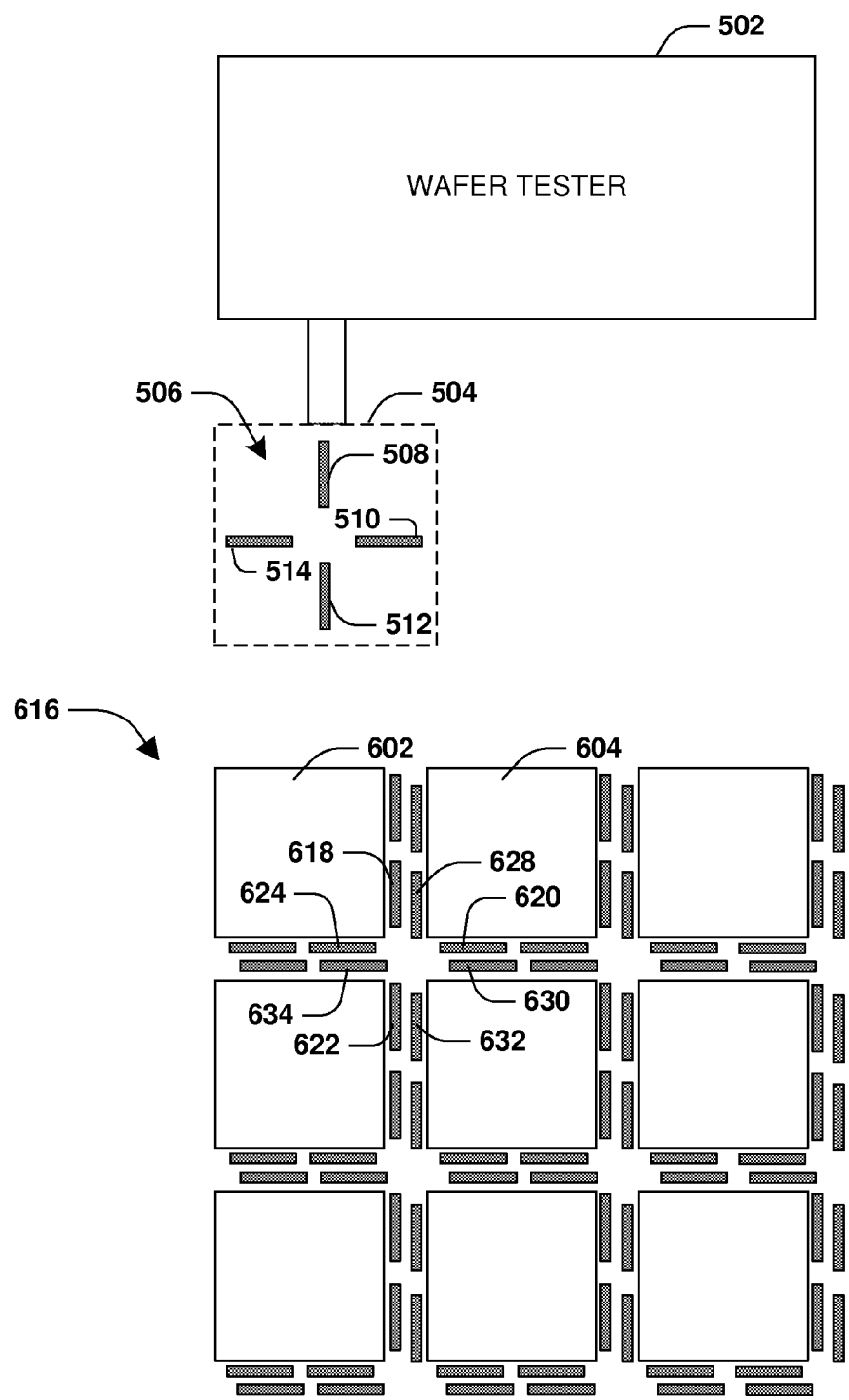
FIG. 6 is an illustration of a system for testing a semiconductor, in accordance with some embodiments.

As illustrated in FIG. 6, the wafer tester 502 is configured to test a semiconductor arrangement 616 using the probe card 504. The semiconductor arrangement 616 comprises testline arrangements formed according to a double scribe width configuration such that two testline arrangements are formed in parallel between circuitry arrangements, such as a first testline arrangement 618 and a fifth testline arrangement 628 formed between a first circuitry arrangement 602 and a second circuitry arrangement 604. The wafer tester 502 is configured to perform a first test on a first set of testline arrangements by mating the probe card 504 with the first testline arrangement 618, a second testline arrangement 622, a third testline arrangement 620, and a fourth testline arrangement 624. In this way, the wafer tester 502 tests the first testline arrangement 618 using the first pin arrangement 508, the second testline arrangement 622 using the second pin arrangement 512, the third testline arrangement 620 using the third pin arrangement 510, and the fourth testline arrangement 624 using the fourth pin arrangement 514.

The wafer tester 502 is configured to perform a second test on a second set of testline arrangements by mating the probe card 504 with the fifth testline arrangement 628, a sixth testline arrangement 632, a seventh testline arrangement 630, and an eighth testline arrangement 634. In this way, the wafer tester 502 tests the fifth testline arrangement 628 using the first pin arrangement 508, the seventh testline arrangement 632 using the second pin arrangement 512, the eighth testline arrangement 630 using the third pin arrangement 510, and the ninth testline arrangement 634 using the fourth pin arrangement 514. The wafer tester 502 may sequentially test other sets of testline arrangements along an x-axis and a y-axis.

Figure 7:
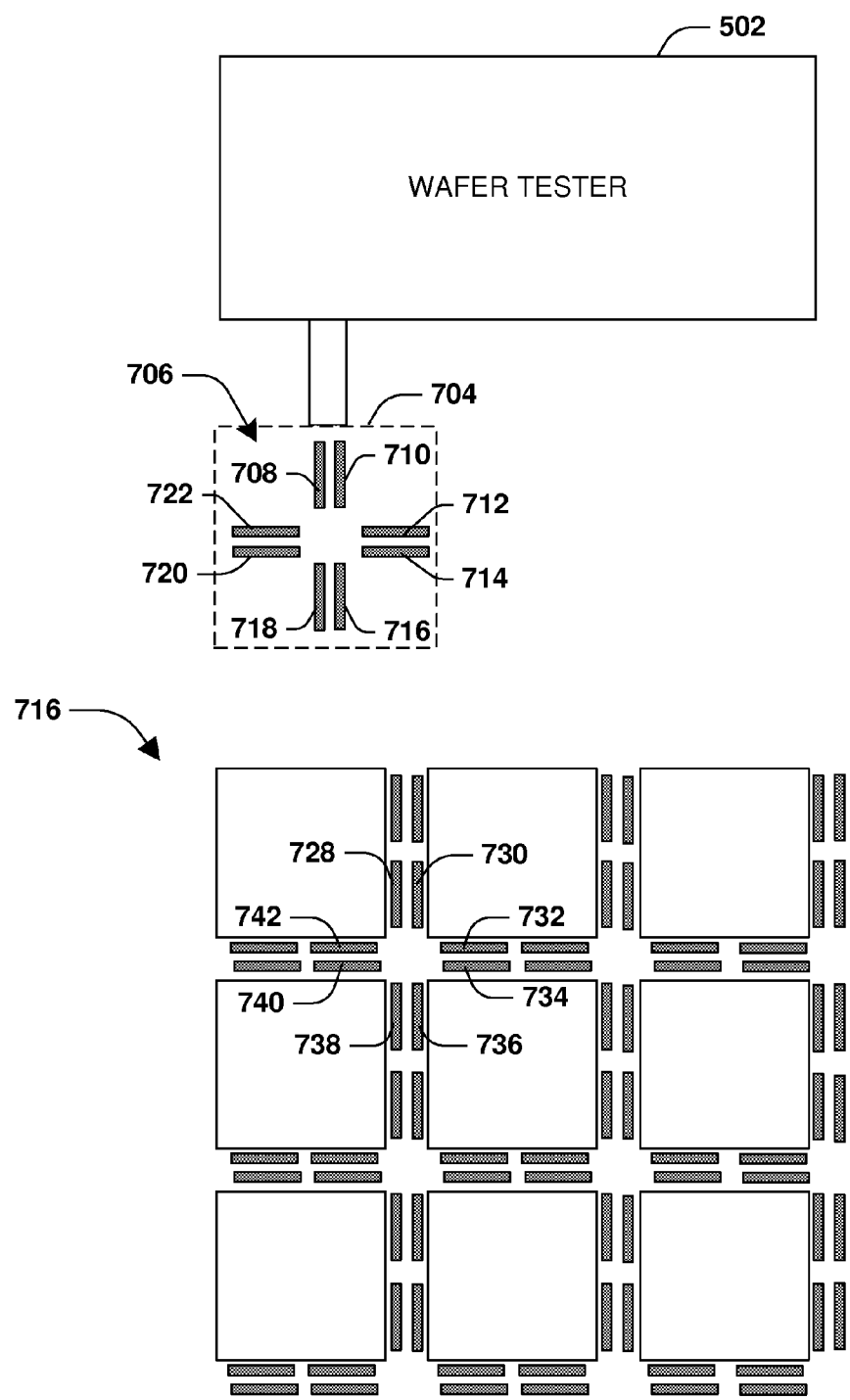
FIG. 7 is an illustration of a system for testing a semiconductor, in accordance with some embodiments.

As illustrated in FIG. 7, the wafer tester 502 is configured to use a probe card 704 comprising a multiple probe arrangement 706 comprising a first pin arrangement 708, a second pin arrangement 710, a third pin arrangement 712, a fourth pin arrangement 714, a fifth pin arrangement 716, a sixth pin arrangement 718, a seventh pin arrangement 720, and an eighth pin arrangement 722. The wafer tester 502 is configured to perform a first test on a first set of testline arrangements by mating the probe card 704 with a first testline arrangement 728, a second testline arrangement 730, a third testline arrangement 732, a fourth testline arrangement 734, a fifth testline arrangement 736, a sixth testline arrangement 738, a seventh testline arrangement 740, and an eighth testline arrangement 742. In this way, the wafer tester 502 tests the first testline arrangement 728 using the first pin arrangement 708, the second testline arrangement 730 using the second pin arrangement 710, the third testline arrangement 732 using the third pin arrangement 712, the fourth testline arrangement 734 using the fourth pin arrangement 714, the fifth testline arrangement 736 using the fifth pin arrangement 716, the sixth testline arrangement 738 using the sixth pin arrangement 718, the seventh testline arrangement 740 using the seventh pin arrangement 720, and the eighth testline arrangement 742 using the eighth pin arrangement 722. The wafer tester 502 may sequentially test other sets of testline arrangements along an x-axis and a y-axis.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a probe card for testing a semiconductor arrangement is provided. The probe card comprises a multidirectional arrangement. The multidirectional arrangement comprises a first pin arrangement aligned in a first direction. The multidirectional arrangement comprises a second pin arrangement aligned in a second direction different than the first direction.

According to an aspect of the instant disclosure, a wafer tester for testing a semiconductor arrangement is provided. The wafer tester comprises a testing component configured to perform a first test of a first testline arrangement of a semiconductor arrangement using a first pin arrangement of a multidirectional probe arrangement. The first pin arrangement is aligned in a first direction. The testing component is configured to perform a second test, concurrently with the first test, of a second testline arrangement of the semiconductor arrangement using a second pin arrangement of the multidirectional probe arrangement. The second pin arrangement is aligned in a second direction different than the first direction.

According to an aspect of the instant disclosure, a method for testing a semiconductor arrangement is provided. The method comprises forming a first testline arrangement along a first scribe line of a semiconductor arrangement. The first testline arrangement is formed in a first direction. A second testline arrangement is formed along a second scribe line of the semiconductor arrangement. The second testline arrangement is formed in a second direction different than the first direction. A multidirectional probe arrangement is utilized to concurrently test the first testline arrangement and the second testline arrangement.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A semiconductor testing arrangement, comprising:
   a probe card comprising:
      a first pin arrangement comprising a first set of linearly arranged pins aligned in a first direction; and
      a second pin arrangement comprising a second set of linearly arranged pins aligned in a second direction; and
   a semiconductor wafer comprising:
      a first set of pads for mating with the first set of linearly arranged pins and aligned in the first direction, wherein the first set of pads is disposed between a first integrated circuit and a second integrated circuit that is immediately adjacent the first integrated circuit;
      a second set of pads for mating with the first set of linearly arranged pins and aligned in the first direction, wherein:
         the second set of pads is disposed between the first integrated circuit and the second integrated circuit,
         the first set of pads is offset from the second set of pads in the second direction perpendicular to the first direction, and
         the first set of pads is offset in the first direction from the second set of pads;
      a third set of pads for mating with the second set of linearly arranged pins and aligned in the second direction, wherein the third set of pads is disposed between the first integrated circuit and a third integrated circuit that is immediately adjacent the first integrated circuit; and
      a fourth set of pads for mating with the second set of linearly arranged pins and aligned in the second direction, wherein:
         the fourth set of pads is disposed between the first integrated circuit and the third integrated circuit,
         the third set of pads is offset in the first direction from the fourth set of pads, and
         the third set of pads is offset in the second direction from the fourth set of pads.

2. The semiconductor testing arrangement of claim 1, wherein the first set of pads is formed along a first scribe line of the semiconductor wafer.

3. The semiconductor testing arrangement of claim 1, wherein the first pin arrangement is configured to perform a first test using the first set of pads and the second pin arrangement configured to perform a second test using the third set of pads concurrently with the first test.

4. The semiconductor testing arrangement of claim 1, wherein:
   the first pin arrangement is configured to perform a first test using the first set of pads and the second pin arrangement is configured to perform a second test using the third set of pads concurrently with the first test; and
   the first pin arrangement is configured to perform a third test using the second set of pads and the second pin arrangement is configured to perform a fourth test using the fourth set of pads concurrently with the third test.

5. The semiconductor testing arrangement of claim 1, wherein:
   the probe card comprises a third pin arrangement comprising a third set of linearly arranged pins aligned in the first direction,
   the semiconductor wafer comprises:
      a fifth set of pads for mating with the third set of linearly arranged pins and aligned in the first direction; and
      a sixth set of pads for mating with the third set of linearly arranged pins and aligned in the first direction,
   the fifth set of pads is disposed between the third integrated circuit and a fourth integrated circuit that is immediately adjacent the third integrated circuit,
   the sixth set of pads is disposed between the third integrated circuit and the fourth integrated circuit,
   a first region devoid of pads extends between a first pad of the first set of pads and a second pad of the fifth set of pads that is nearest the first pad in the first direction,
   a second region devoid of pads extends between a third pad of the second set of pads and a fourth pad of the sixth set of pads that is nearest the third pad in the first direction, and
   a width of the first region, measured from the first pad to the second pad, is equal to a width of the second region, measured from the third pad to the fourth pad.

6. A method for testing a semiconductor arrangement, comprising:

utilizing a multidirectional probe arrangement to concurrently test a first testline arrangement and a second testline arrangement, comprising:
mating a first set of linearly arranged pins of the multidirectional probe arrangement aligned in a first direction with a first set of pads of the first testline arrangement aligned in the first direction and disposed between a first integrated circuit and a second integrated circuit that is immediately adjacent the first integrated circuit; and
mating a second set of linearly arranged pins of the multidirectional probe arrangement aligned in a second direction, different than the first direction, with a second set of pads of the second testline arrangement aligned in the second direction and disposed between the first integrated circuit and a third integrated circuit that is immediately adjacent the first integrated circuit; and
utilizing the multidirectional probe arrangement to concurrently test a third testline arrangement and a fourth testline arrangement, comprising:
mating the first set of linearly arranged pins with a third set of pads aligned in the first direction and offset in the first direction from the first set of pads while the first set of linearly arranged pins is not mated with the first set of pads,
wherein the third set of pads is disposed between the first integrated circuit and the second integrated circuit; and
mating the second set of linearly arranged pins with a fourth set of pads aligned in the second direction and offset in the second direction from the second set of pads while the second set of linearly arranged pins is unmated from the first set of pads, wherein the fourth set of pads is disposed between the first integrated circuit and the third integrated circuit.

7. The method of claim 6, wherein the utilizing a multidirectional probe arrangement to concurrently test a first testline arrangement and a second testline arrangement comprises:
utilizing the multidirectional probe arrangement to test a fifth testline arrangement concurrently with the first testline arrangement and the second testline arrangement.

8. The method of claim 7, wherein the utilizing a multidirectional probe arrangement to test a fifth testline arrangement comprises:
mating a third set of linearly arranged pins of the multidirectional probe arrangement aligned in the first direction with a fifth set of pads of the fifth testline arrangement aligned in the first direction and disposed between the third integrated circuit and a fourth integrated circuit.

9. The method of claim 6, wherein the second set of linearly arranged pins is perpendicular to the first set of linearly arranged pins.

10. A semiconductor testing arrangement, comprising:
a semiconductor wafer comprising:
a first set of pads aligned in a first direction for mating with a first set of linearly arranged pins of a probe card, wherein the first set of pads is disposed between a first integrated circuit and a second integrated circuit that is immediately adjacent the first integrated circuit;
a second set of pads aligned in the first direction for mating with the first set of linearly arranged pins, wherein:
the second set of pads is disposed between the first integrated circuit and the second integrated circuit,
the first set of pads is offset from the second set of pads in a second direction different than the first direction, and
the first set of pads is offset in the first direction from the second set of pads;
a third set of pads aligned in the second direction for mating with a second set of linearly arranged pins of the probe card, wherein the third set of pads is disposed between the first integrated circuit and a third integrated circuit that is immediately adjacent the first integrated circuit; and
a fourth set of pads aligned in the second direction for mating with the second set of linearly arranged pins, wherein:
the fourth set of pads is disposed between the first integrated circuit and the third integrated circuit, and
the third set of pads is offset in the second direction from the fourth set of pads.

11. The semiconductor testing arrangement of claim 10, wherein the second direction is perpendicular to the first direction.

12. The semiconductor testing arrangement of claim 10, wherein:
the semiconductor wafer comprises a fifth set of pads aligned in the first direction for mating with a third set of linearly arranged pins of the probe card, and
the fifth set of pads is disposed between the third integrated circuit and a fourth integrated circuit.

13. The semiconductor testing arrangement of claim 12, wherein the fifth set of pads is aligned for mating with the third set of linearly arranged pins concurrently with the first set of pads mating with the first set of linearly arranged pins.

14. The semiconductor testing arrangement of claim 10, wherein:
the third set of pads is aligned for mating with the second set of linearly arranged pins concurrently with the first set of pads mating with the first set of linearly arranged pins; and
the fourth set of pads is aligned for mating with the second set of linearly arranged pins concurrently with the second set of pads mating with the first set of linearly arranged pins.

15. The semiconductor testing arrangement of claim 10, wherein:
the semiconductor wafer comprises:
a fifth set of pads for mating with a third set of linearly arranged pins and aligned in the first direction; and
a sixth set of pads for mating with the third set of linearly arranged pins and aligned in the first direction.

16. The semiconductor testing arrangement of claim 15, wherein the fifth set of pads is disposed between the third integrated circuit and a fourth integrated circuit that is immediately adjacent the second integrated circuit and the third integrated circuit.

17. The semiconductor testing arrangement of claim 16, wherein the sixth set of pads is disposed between the third integrated circuit and the fourth integrated circuit.

18. The semiconductor testing arrangement of claim 15, wherein:
a first region devoid of pads extends between a first pad of the first set of pads and a second pad of the fifth set of pads that is nearest the first pad in the first direction, a second region devoid of pads extends between a third pad of the second set of pads and a fourth pad of the sixth set of pads that is nearest the third pad in the first direction, and a width of the first region, measured from the first pad to the second pad, is equal to a width of the second region, measured from the third pad to the fourth pad.

19. The semiconductor testing arrangement of claim 10, wherein the first set of pads is formed along a first scribe line of the semiconductor wafer.

20. The semiconductor testing arrangement of claim 19, wherein the second set of pads is formed along a second scribe line of the semiconductor wafer.

* * * * *